(12) United States Patent
Okawa et al.

(10) Patent No.: US 6,894,351 B2
(45) Date of Patent: May 17, 2005

(54) SEMICONDUCTOR DEVICE FOR ELECTROSTATIC PROTECTION

(75) Inventors: Kazuhiko Okawa, Chino (JP); Takayuki Saiki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/329,676

(22) Filed: Dec. 27, 2002

(65) Prior Publication Data

US 2003/0141545 A1 Jul. 31, 2003

(30) Foreign Application Priority Data

Jan. 11, 2002 (JP) .......................................... 2002-004606

(51) Int. Cl.[7] .......................... H01L 27/01; H01L 27/12; H01L 29/74; H01L 31/111
(52) U.S. Cl. ...................... 257/347; 257/122; 257/173; 257/355
(58) Field of Search ................................. 257/347–354, 257/355–367, 119, 120, 122, 124, 147, 153, 173

(56) References Cited

U.S. PATENT DOCUMENTS

| | | | | |
|---|---|---|---|---|
| 5,240,865 A | * | 8/1993 | Malhi .......................... | 438/135 |
| 5,708,288 A | * | 1/1998 | Quigley et al. .............. | 257/355 |
| 5,937,298 A | * | 8/1999 | Hung et al. .................. | 438/286 |
| 5,981,983 A | * | 11/1999 | Funaki et al. ................ | 257/138 |
| 6,015,992 A | * | 1/2000 | Chatterjee et al. .......... | 257/350 |
| 6,081,002 A | * | 6/2000 | Amerasekera et al. ...... | 257/173 |
| 6,104,045 A | * | 8/2000 | Forbes et al. ................ | 257/141 |
| 6,242,763 B1 | * | 6/2001 | Chen et al. .................. | 257/107 |
| 6,531,738 B1 | * | 3/2003 | Uemoto et al. .............. | 257/347 |

FOREIGN PATENT DOCUMENTS

JP        B2 2-52426        11/1990

* cited by examiner

Primary Examiner—Shouxiang Hu
(74) Attorney, Agent, or Firm—Oliff & Berridge, PLC

(57) ABSTRACT

The invention makes it possible to form thyristers and SCRs that show a good discharge efficiency upon application of static electricity in semiconductor devices using a SOI substrate. A semiconductor device is equipped with a connection terminal for connection with an external element, a dielectric substrate having a semiconductor layer formed therein, a first region of a first conductive type that is formed in the semiconductor layer and electrically connected to the connection terminal, a second region of a second conductive type that is formed in the semiconductor layer and electrically connected to the first region, a third region of the first conductive type that is formed adjacent to the second region in the semiconductor layer, and a fourth region of the second conductive type that is formed adjacent to the third region in the semiconductor layer.

9 Claims, 4 Drawing Sheets

SEMICONDUCTOR DEVICE FOR ELECTROSTATIC PROTECTION

BACKGROUND OF THE INVENTION

1. Field of Invention

The present invention generally relates to semiconductor devices, and more particularly to a semiconductor device having a thyrister and SCR (silicon controlled rectifier) for electrostatic protection, which are formed on a SOI (silicon on insulator) substrate.

2. Description of Related Art

Internal circuits of a semiconductor device may be destroyed if a high voltage due to static electricity is applied to input terminals or output terminals. This type of destruction due to static electricity becomes problematic, particularly in CMOS type semiconductor devices. To prevent destructions by static electricity, a method in which a protection circuit using a thyrister or SCR is connected to an output terminal and/or input terminal can be used.

For example, Japanese published patent (Tokko) HEI 2-52426 describes a protection circuit in a CMOS type semiconductor device, such as the one shown in FIG. 4. The protection circuit is equipped with a first contact region 45 of a first conductive type that is formed in a semiconductor substrate 43 of the first conductive type and is connected to a reference power supply voltage $V_{SS}$, a first semiconductor region 46 of a second conductive type that is formed in the substrate and is connected to the reference power supply voltage, a second contact region 48 of the second conductive type that is formed in a well region 44 and is connected to a specified signal input terminal or a specified signal output terminal, and a second semiconductor region 47 of the first conductive type that is formed in the well region and is connected to the signal input terminal or the signal output terminal.

In FIG. 4, the semiconductor substrate 43 includes a P+ type epitaxial layer 41 and a P type epitaxial layer 42. Also, the input terminal IN is connected to a P channel MOS transistor QP1 and an N channel MOS transistor QN1.

When a positive high voltage is applied to the input terminal IN, a current flows from the P+ type contact region 47 that is connected to the input terminal IN to the N+ type semiconductor region 46 through the N well 44 and the P type epitaxial layer 42.

On the other hand, when a negative voltage is applied to the input terminal IN, a current flows along a normal direction of discharge path from the P+ type epitaxial layer 41 that is connected to the reference power supply voltage $V_{SS}$ or the P+ type contact region 45, through the P type epitaxial layer 42 and the N well 44, to the input terminal IN that is connected to the N+ type contact region 48. In this manner, a related art protection circuit using a thyrister needs a few components in a longitudinal direction including a well.

A SOI substrate, in which a single crystal silicon layer is grown on a dielectric substrate, is used to attain good electrical isolation among a plurality of MOS transistors. By using such a SOI substrate, parasitic capacitance of the MOS transistors can be reduced, and good high frequency characteristics can be obtained.

However, in a semiconductor device using a SOI substrate, since components cannot be disposed in a longitudinal direction, it is difficult to form a thyrister or a SCR that shows a good discharge efficiency when static electricity is applied.

SUMMARY OF THE INVENTION

In view of the problems described above, the present invention makes it possible to form a thyrister or a SCR that shows a good discharge efficiency when static electricity is applied in a semiconductor device that uses a SOI substrate.

To address or solve the problems described above, a semiconductor device in accordance with the present invention includes: a connection terminal for connection with an external element; a dielectric substrate having a semiconductor layer formed therein; a first region of a first conductive type that is formed in the semiconductor layer and electrically connected to the connection terminal; a second region of a second conductive type that is formed in the semiconductor layer and electrically connected to the first region; a third region of the first conductive type that is formed adjacent to the second region in the semiconductor layer; and a fourth region of the second conductive type that is formed adjacent to the third region in the semiconductor layer.

The fourth region may be electrically connected to a wiring to supply a power supply potential on a high potential side or a power supply potential on a low potential side.

Also, the semiconductor device in accordance with the present invention may further include a gate electrode formed over the third region through a dielectric film. In this case, the gate electrode may be electrically connected to a wiring to supply a power supply potential on a high potential side or a power supply potential on a low potential side.

Furthermore, the first region and the second region may be electrically connected to each other by a salicide layer that is formed on the semiconductor layer. The third region may preferably be formed by further injecting an impurity of the first conductive type in the semiconductor layer of the first conductive type.

Also, the semiconductor device in accordance with the present invention may further include: a fifth region of the second conductive type that is formed in the semiconductor layer and electrically connected to the connection terminal; a sixth region of the first conductive type that is formed adjacent to the fifth region in the semiconductor layer; a seventh region of the second conductive type that is formed adjacent to the sixth region in the semiconductor layer; and a second gate electrode that is formed over the sixth region through a dielectric film. In this case, the seventh region and the second gate electrode may be electrically connected to a wiring to supply a power supply potential on a high potential side or a power supply potential on a low potential side.

In accordance with the invention having the structure described above, a thyrister or a SCR that shows a good discharge efficiency when static electricity is applied can be formed in a semiconductor device using a SOI substrate.

DETAILED DESCRIPTION OF PREFERRED EMBODIMENTS

Embodiments of the present invention are described in detail below with reference to the accompanying drawings.

The same components are indicated by the same reference numbers, and their description is not repeated.

Figure 1:
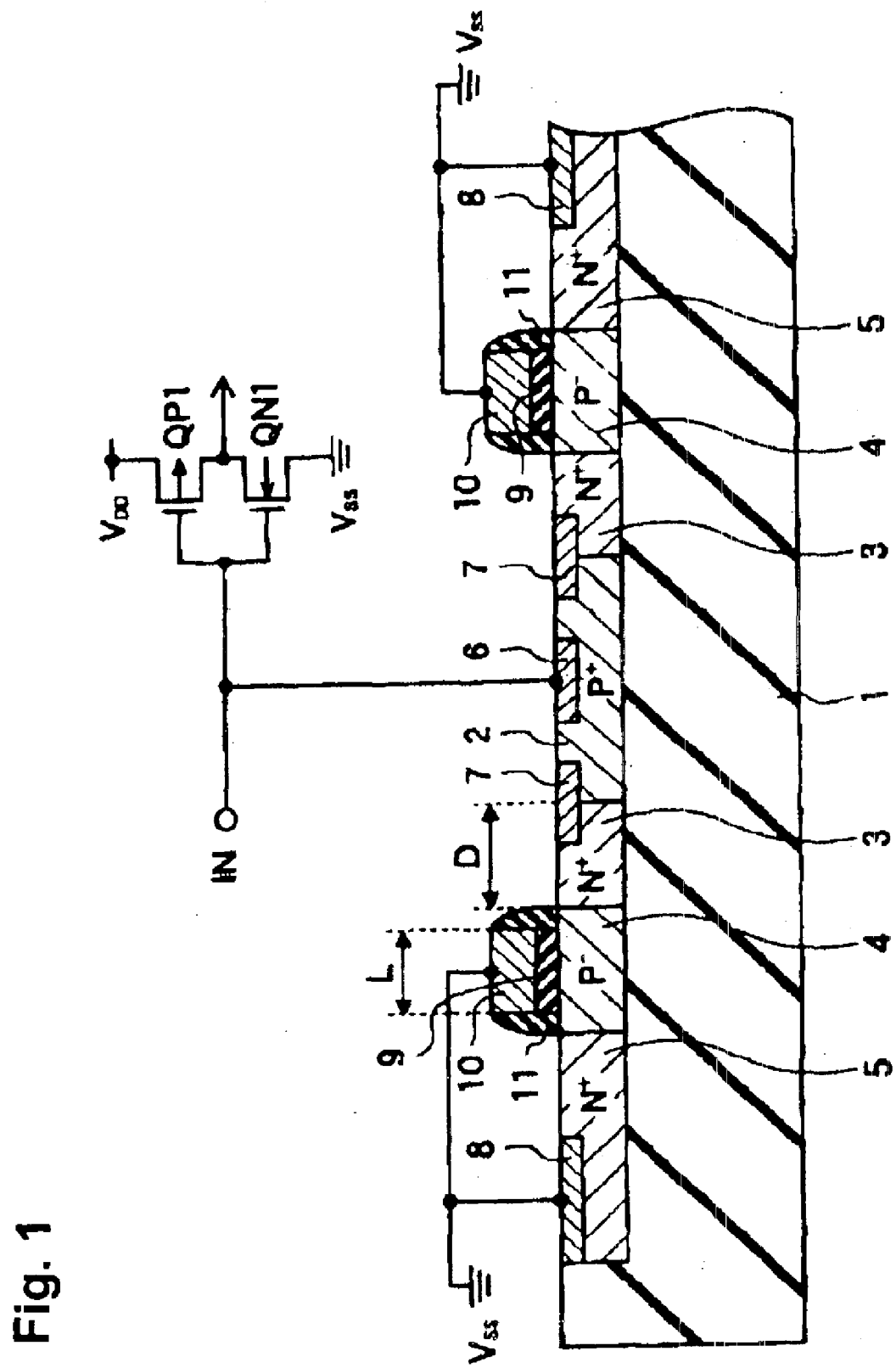
FIG. 1 is a schematic that shows a part of a semiconductor device in accordance with a first embodiment of the present invention.

FIG. 1 is a schematic that shows a part of a semiconductor device in accordance with a first embodiment of the present invention. The semiconductor device is formed with single crystal silicon grown on a dielectric substrate 1, such as sapphire, quartz or the like. In the single crystal silicon layer, a protection circuit is formed to protect a P channel MOS transistor QP1 and an N channel MOS transistor QN1 that are connected to an input terminal IN from static electricity. A source of the transistor QP1 is connected to a power supply potential $V_{DD}$ on a high potential side, and a source of the transistor QN1 is connected to a power supply potential $V_{SS}$ on a low potential side (a ground potential in the present embodiment).

In the present embodiment, two sets of protection circuits that operate when a positive high potential is applied to the input terminal IN are symmetrically disposed about a salicide layer 6 as a center that is connected to the input terminal IN.

As shown in FIG. 1, the protection circuit includes a $P^+$ region 2, a $P^-$ region 4, and $N^+$ regions 3 and 5 that are formed on both sides of the $P^-$ region 4, which are formed in the single crystal silicon layer. The salicide layer 6 is formed on the $P^+$ region 2, and the salicide layer 6 is connected to the input terminal IN. The $P^+$ region 2 and the $N^+$ region 3 are connected by the salicide layer 7. In accordance with this structure, the $P^+$ region 2 and the $N^+$ region 3 are ohmically connected to each other. Also, a gate electrode 10 is formed over the $P^-$ region 4 through a gate dielectric film 9. Further, a salicide layer 8 is formed on the $N^+$ region 5, and the salicide layer 8 is connected to a power supply potential $V_{SS}$ on a low potential side.

Figure 2:
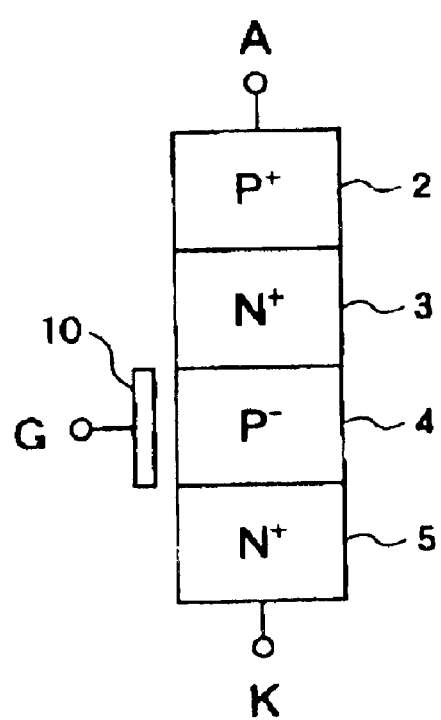
FIGS. 2(a) and 2(b) are schematics that show equivalent circuits of the structure of a protection circuit included in the semiconductor device shown in FIG. 1.
Figure 2:
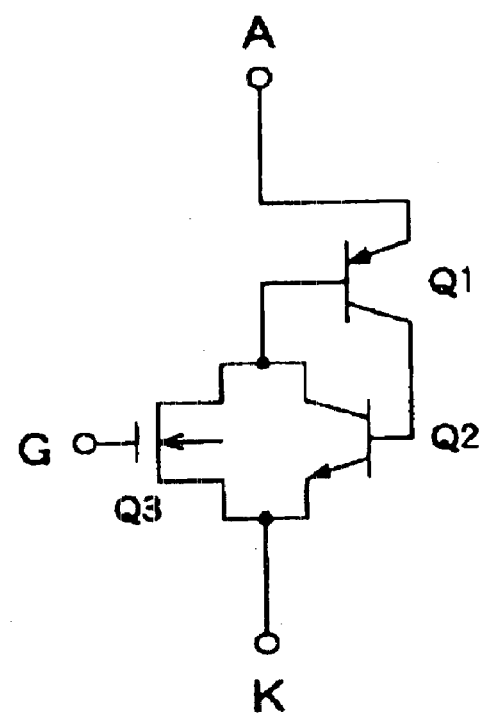

FIGS. 2(a) and 2(b) are schematics that show equivalent circuits of the structure of the protection circuit. As indicated in FIG. 2(a), the $P^+$ region 2, $N^+$ region 3, $P^-$ region 4 and $N^+$ region 5 are successively connected, to form a thyrister. Further, since the gate electrode 10 is formed over the $P^-$ region 4 through the gate dielectric film, an SCR, a three-terminal device that is capable of controlling a turn-on voltage (switching voltage) $V_S$, is formed. The SCR includes an anode A, a cathode K and a gate G. In FIG. 2(b), an equivalent circuit of the thyrister can be represented by two bi-polar transistors Q1 and Q2. In the case of the SCR, it can be assumed that the bi-polar transistor Q2 also operates as an N channel field effect transistor Q3 having a gate.

In FIG. 2(a), when the cathode potential is higher than the anode potential, the PN junction between the $P^-$ region 4 and the $N^+$ region 3 is biased in a reverse direction. Accordingly, when the voltage between the anode and the cathode is small, current scarcely flows, and the SCR is placed in an OFF state. When the voltage between the anode and the cathode exceeds the switching voltage $V_S$, the PN junction between the $P^-$ region 4 and the $N^+$ region 3 has an avalanche breakdown, such that the SCR turns ON. Values of the switching voltage $V_S$ can be changed by voltages applied to the gate electrode 10. In the present embodiment, the transistor Q3 is turned OFF in a normal state through connecting the gate electrode 10 to the power supply voltage $V_{SS}$ on a low potential side. However, by controlling the potential on the gate electrode 10 by an internal circuit, it can be operated as an N channel output transistor. Also, by additionally conducting an impurity injection to form the $P^-$ region 4, to thereby increase the impurity concentration of the $P^-$ region 4 to a higher level than the impurity concentration of the ordinary silicon layer, the switching voltage $V_S$ can be further lowered.

When the SCR turns on, the voltage between the anode and the cathode lowers and is clamped at a generally constant value. Referring back to FIG. 1, the clamp voltage of the SCR can be adjusted by the length (gate length) L of the gate electrode. Also, the clamp voltage of the SCR can also be adjusted by the length D of the $N^+$ region 3 that corresponds to the drain of the N channel field effect transistor Q3 indicated in FIG. 2(b). By making these values smaller, the clamp voltage also becomes smaller.

Next, a second embodiment of the present invention is described below.

Figure 3:
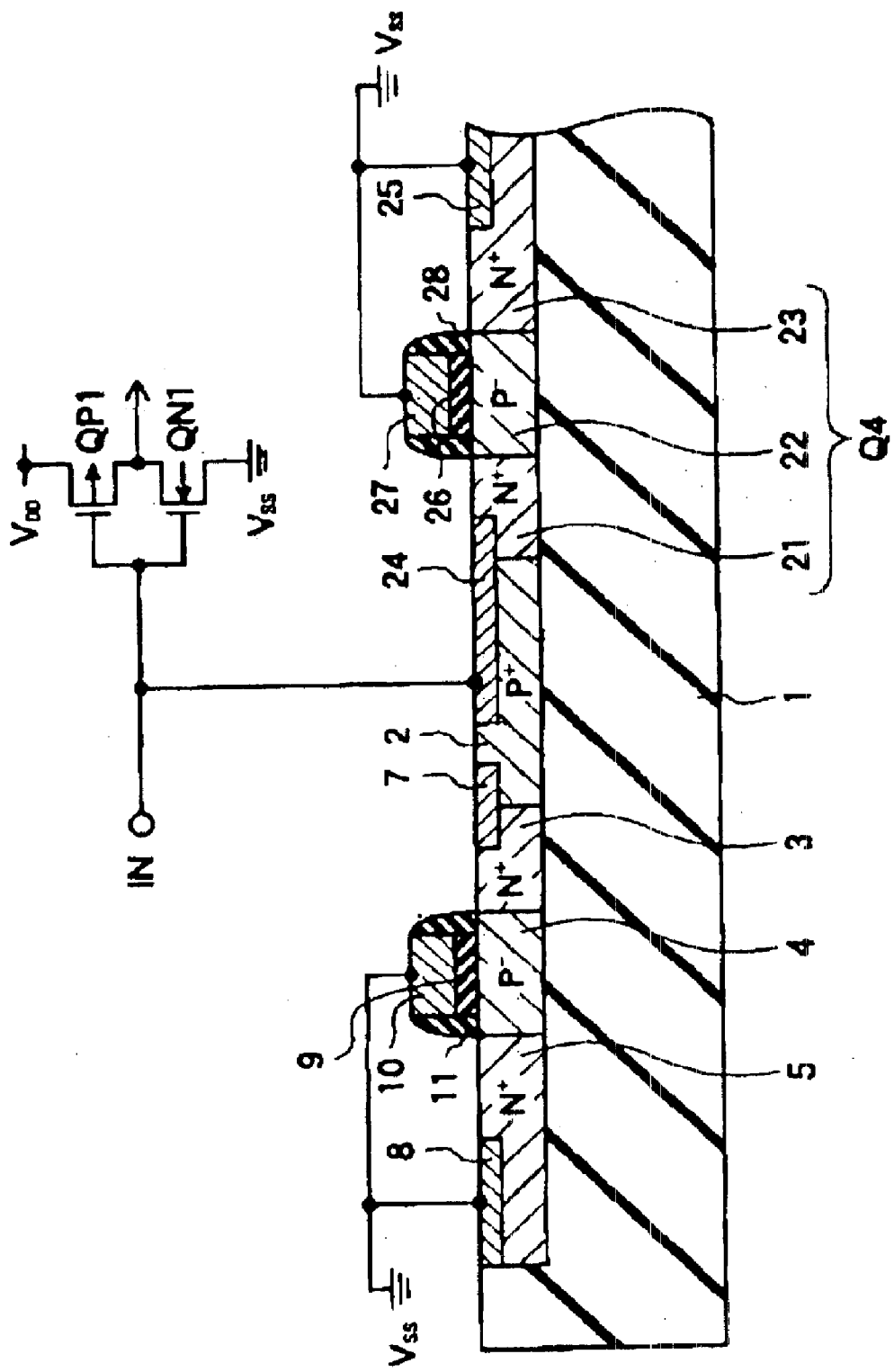
FIG. 3 is a schematic that shows a part of a semiconductor device in accordance with a second embodiment of the present invention.
Figure 4:
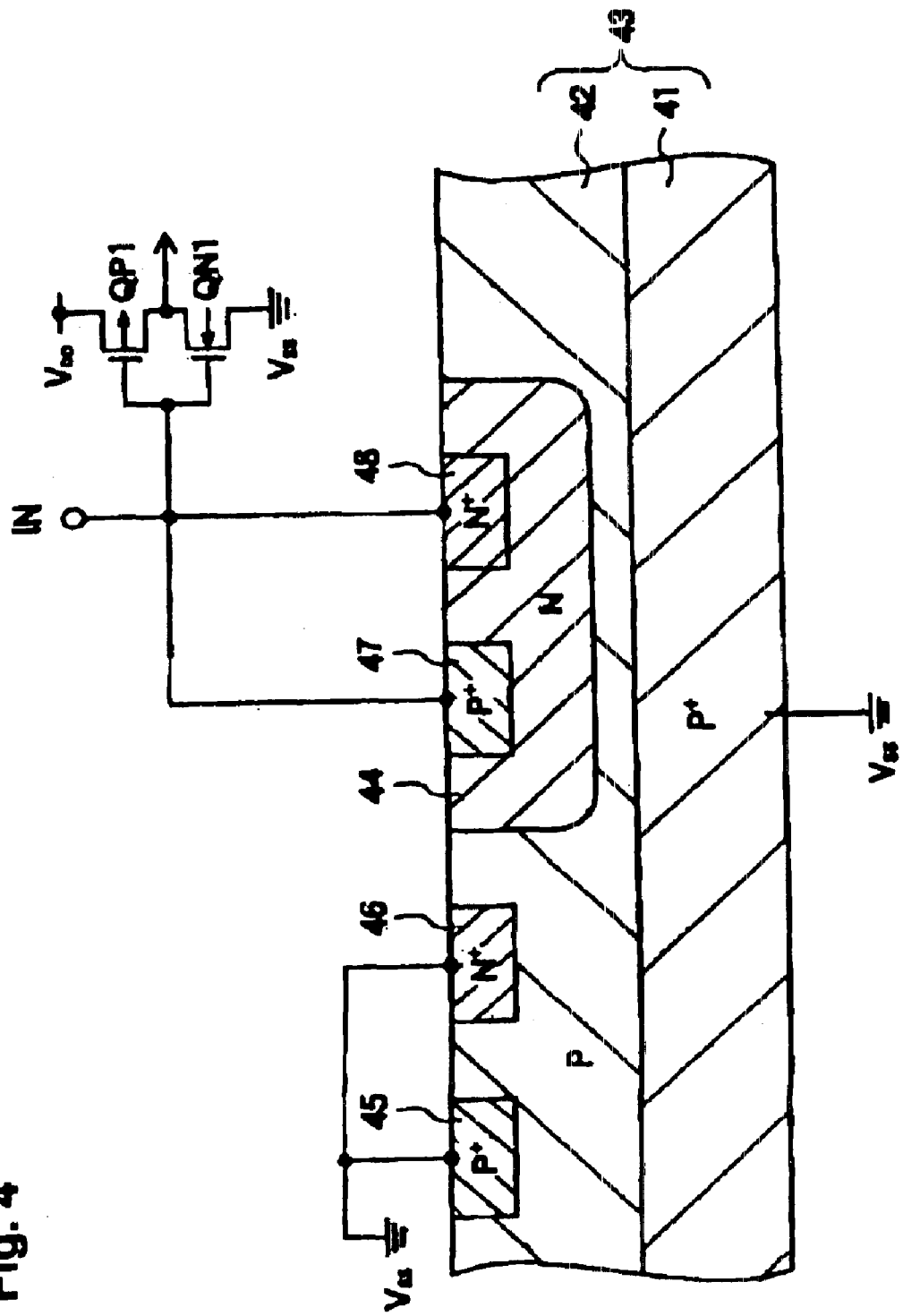
FIG. 4 is a schematic that shows a part of a related art semiconductor device.

FIG. 3 is a schematic that shows a part of a semiconductor device in accordance with a second embodiment of the present invention. The present embodiment is provided with a first protection circuit that operates when a positive high voltage is applied to an input terminal IN, and a second protection circuit that operates when a negative voltage is applied to the input terminal IN.

As shown in FIG. 3, the first protection circuit that includes a $P^+$ region 2, $N^+$ region 3, $P^-$ region 4 and $N^+$ region 5 is similar to the one described in the first embodiment. Further, in the present embodiment, the second protection circuit has an N channel field effect transistor Q4 that includes an $N^+$ region 21, $P^-$ region 22, and $N^+$ region 23.

A salicide layer 24 is formed on the $P^+$ region 2 and the $N^+$ region 21, and the salicide layer 24 is connected to the input terminal IN. Also, a gate electrode 27 is formed over the $P^-$ region 22 through a gate dielectric film 26, and sidewalls 28 are formed on both side walls of the gate electrode 27. Further, a salicide layer 25 is formed on the $N^+$ region 23, and the salicide layer 25 is connected to a power supply potential $V_{SS}$ on a lower potential side.

When a negative voltage is applied to the input terminal IN, the N channel field effect transistor Q4 is placed in an ON state, and current flows from the $N^+$ region 23 that is connected to the power supply potential $V_{SS}$ on a lower potential side, through the $P^-$ region 22, to the $N^+$ region 21.

In the embodiments described above, a description is provided as to circuit examples that accommodate P type substrates grounded to a power supply potential $V_{SS}$ on a low potential side. However, the present invention is also applicable to circuits that accommodate N type substrates grounded to a power supply potential $V_{DD}$ on a high potential side. In such cases, effects similar to those of the above-described embodiment can be obtained.

As described above, in accordance with the present invention, thyristers and SCRs that present good discharge characteristics upon application of static electricity can be formed in semiconductor devices that use a SOI substrate. As a result, CMOS type semiconductor devices having a small electrostatic protection circuit area with a high electrostatic breakdown voltage can be realized.

What is claimed is:

1. A semiconductor device for use with an external element, comprising:

a connection terminal for connection with the external element, and two protection circuits substantially symmetrically disposed about the connection terminal, each protection circuit comprising:

a dielectric substrate having a semiconductor layer formed thereon;

a first region of a first conductive type that is formed in the semiconductor layer and electrically connected to the connection terminal by a first silicide layer formed on the semiconductor layer;

a second region of a second conductive type that is formed in the semiconductor layer and electrically connected to the first region;

a second silicide layer formed above a boundary between the first region and the second region, the second silicide layer being in direct contact with the first and second regions and being separated from the first silicide layer;

a third region of the first conductive type that is formed adjacent to the second region in the semiconductor layer;

a fourth region of the second conductive type that is formed adjacent to the third region in the semiconductor layer; and a gate electrode formed over the third region through a dielectric film, wherein each of the first through fourth regions extends from a top surface of the semiconductor layer to a bottom surface of the semiconductor layer.

2. The semiconductor device according to claim 1, the fourth region being electrically connected to a wiring to supply a power supply potential on a high potential side or a power supply potential on a low potential side.

3. The semiconductor device according to claim 1, said gate electrode not being formed over said second region and said fourth region.

4. The semiconductor device according to claim 1, the gate electrode being electrically connected to a wiring to supply a power supply potential on a high potential side or a power supply potential on a low potential side.

5. The semiconductor device according to claim 1, wherein the second silicide layer is a salicide layer that is formed on the semiconductor layer.

6. The semiconductor device according to claim 1, further comprising:

a fifth region of the second conductive type that is formed in the semiconductor layer and electrically connected to the connection terminal;

a sixth region of the first conductive type that is formed adjacent to the fifth region in the semiconductor layer;

a seventh region of the second conductive type that is formed adjacent to the sixth region in the semiconductor layer; and a second gate electrode that is formed over the sixth region through a dielectric film.

7. The semiconductor device according to claim 6, the seventh region and the second gate electrode being electrically connected to a wiring to supply a power supply potential on a high potential side or a power supply potential on a low potential side.

8. A thyrister comprising the semiconductor device according to claim 1.

9. The semiconductor device according to claim 1, wherein the first and second silicide layers are formed from a salicide layer.

* * * * *